(12) United States Patent
Sugimoto (10) Patent No.: US 6,192,494 B1
(45) Date of Patent: Feb. 20, 2001

(54) APPARATUS AND METHOD FOR ANALYZING CIRCUIT TEST RESULTS AND RECORDING MEDIUM STORING ANALYTICAL PROGRAM THEREFOR

(75) Inventor: Masaaki Sugimoto, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/095,711

(22) Filed: Jun. 11, 1998

(30) Foreign Application Priority Data

Jun. 11, 1997 (JP) .................................................. 9-152740

(51) Int. Cl.⁷ .............................. G11C 29/00; G11C 7/00
(52) U.S. Cl. ........................... 714/718; 714/719; 714/25; 714/37; 365/201
(58) Field of Search .................................. 714/718, 719, 714/25, 26, 37; 365/201

(56) References Cited

U.S. PATENT DOCUMENTS

| | | | |
|---|---|---|---|
| 5,442,642 | * 8/1995 | Ingalls et al. | 714/733 |
| 5,850,404 | 12/1998 | Sanda | 714/745 |

FOREIGN PATENT DOCUMENTS

| | | |
|---|---|---|
| 61-243378 | 10/1986 | (JP) . |
| 63-214679 | 9/1988 | (JP) . |
| 7-221156 | 8/1995 | (JP) . |
| 8-201486 | 8/1996 | (JP) . |
| 9-96662 | 4/1997 | (JP) . |
| 9-179605 | 7/1997 | (JP) . |
| 10-92883 | 4/1998 | (JP) . |

* cited by examiner

Primary Examiner—Emmanuel L. Moise
(74) Attorney, Agent, or Firm—Foley & Lardner (57) ABSTRACT

An intelligence data base 23 stores interconnection information and position information on the basis of a substrate about a decoder for an LSI memory cell and memory cells and further stores a program for judging whether the memory cell regarded as defective by a electric testing device 22 is really defective. A defect data separating computer 21 refers to the intelligence data base 23 about whether the memory cell regarded as defective by the electric testing device 22 is really defective. On this occasion, the intelligence data base 23 judges whether the memory cell in concern is truly defective and subsequently designates the memory cell's as position on the substrate according to the position information.

14 Claims, 9 Drawing Sheets

APPARATUS AND METHOD FOR ANALYZING CIRCUIT TEST RESULTS AND RECORDING MEDIUM STORING ANALYTICAL PROGRAM THEREFOR

BACKGROUND OF THE INVENTION

The present invention relates to an apparatus and a method for analyzing circuit test results, and further a recording medium storing an analytical program for analyzing the circuit test results, which are suitably used for an LSI having memory cells.

Electrical tests for an LSI having memory cells are carried out by an electric testing device. The subject of the electrical test is the memory cells. Specifically, through the electric testing device, certain test data are written into each memory cell on the LSI and thereafter it is checked whether each written datum can be non-defectively read out therefrom.

There are included both inherently defective memory cells and entirely non-defective memory cells in those memory cells as judged to be defective by the electric testing device. Such a memory cell as to be regarded as defective by the testing device notwithstanding its being indeed non-defective is called a pseudo- defective memory cell hereinafter.

In order to distinguish between an actually defective memory cell and a pseudo-defective memory cell among those as judged to be defective memory cells as above, it is necessary to re-examine each of all memory cells as judged to be defective. Such a re-examination requires a great deal of labor.

An address of the memory cell as judged to be defective is obtained from data of the circuit test results, however, it is far difficult to get hold of where the memory cell is positioned on a wafer.

SUMMARY OF THE INVENTION

Thus, an object of the present invention is to provide a circuit test result analyzing apparatus which can discriminate between a really defective memory cell and a pseudo-defective memory cell and further designate any positions of the really defective memory cells on a wafer.

Another object of the present invention is to provide a method of analyzing the circuit test results, which is suitable for the above circuit test result analyzing apparatus.

A still another object of the present invention is to provide a recording medium storing an analytical program for analyzing the circuit test results.

The circuit test result analyzing apparatus according to the present invention is directed to analyzing the test results of such a circuit as to comprise a primary circuit and a secondary circuit group including a plurality of secondary circuits each having the possibility of functioning defectively under the influence of the primary circuit.

According to an aspect of the present invention, the circuit test result analyzing apparatus comprises a data base section and a defect data separating section for separating defect data. The data base section holds, as information in a combination form between the primary circuit and the secondary circuit group, position information about the primary circuit and the secondary circuit group each disposed on a substrate and interconnection information between the primary circuit and the secondary circuit group. The data base section also judges that the primary circuit causes the defects when all the secondary circuits function defectively in an equal level. The data base section further judges that a specific secondary circuit causes the defects when the specific secondary circuit of the secondary circuit group functions more defectively than any other secondary circuits. The defect data separating section is to separate between one kind of defect data attributable to a circuit causing some defects and the other kind of defect data attributable to a circuit causing no defects, according to the judgments in the data base section.

A method of analyzing the circuit test results according to the present invention is directed to analyzing the circuit test results of the circuit comprising the primary circuit and the secondary circuit group consisting of a plurality of secondary circuits each having the possibility of functioning defectively under the influence of the primary circuit.

According to another aspect of the present invention, the method of analyzing circuit test results comprises a first step of holding, as information in a combination form of the primary circuit and the secondary circuit group, position information about the primary circuit and the secondary circuit group each disposed on a substrate and interconnection information between the primary circuit and the secondary circuit group; a second step of judging that the primary circuit causes the defects when all the secondary circuits function defectively alike, and that a specific secondary circuit causes the defect when the specific secondary circuit functions more defectively than any other secondary circuits; and a third step of separating the defect data between one kind of defect data attributable to a circuit causing some defect and the other kind of defect data attributable to a circuit causing no defect, according to the judgments in the second step.

According to the present invention, it also provides a recording medium storing an analytical program for analyzing the circuit test results of the circuit comprising the primary circuit and the secondary circuit group consisting of a plurality of secondary circuits each having the possibility of functioning defectively under the influence of the primary circuit.

The analytical program for analyzing test results is intended to carry out the following steps: a first step of holding in a computer, as information in a combination form between the primary circuit and the secondary circuit group, position information about the primary circuit and the secondary circuit group each disposed on a substrate and interconnection information between the primary circuit and the secondary circuit group; a second step of judging that the primary circuit causes the defects when all the secondary circuits function defectively alike, and that a specific secondary circuit causes the defective when the specific secondary circuit of the secondary circuit group functions more defectively than any other secondary circuits; and a third step of separating the defect data between one kind of defect data attributable to a causing some defects and the other kind of defect data attributable to a circuit causing no defects according to the judgments in the second step.

BRIEF DESCRIPTION OF THE DRAWINGS

The present invention will hereinafter be described in detail with reference to the accompanying drawings, in which.

DESCRIPTION OF THE PREFERRED EMBODIMENTS

Figure 1:
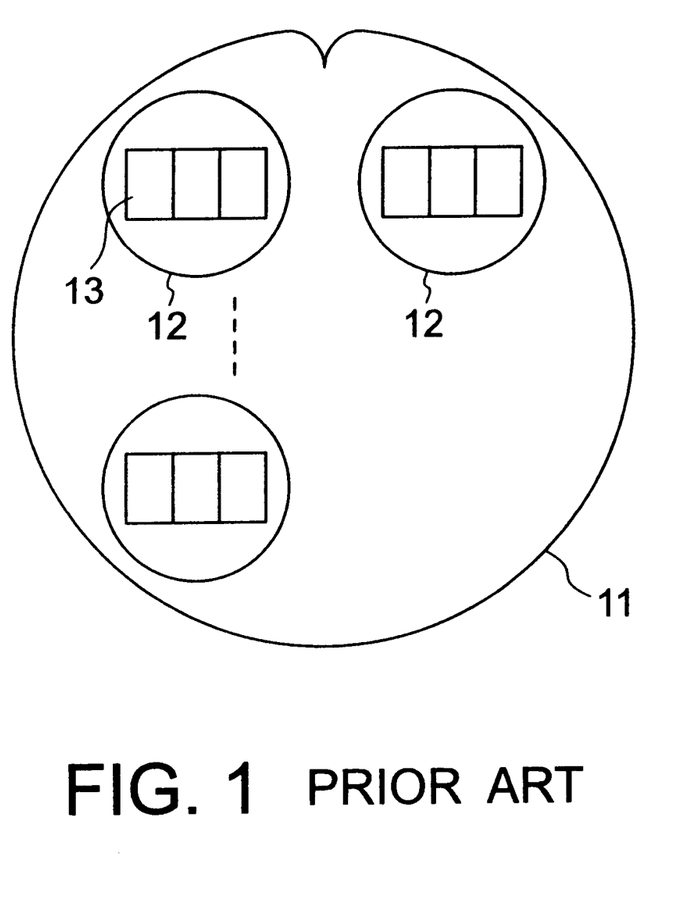
FIG. 1 shows one example of a wafer.

Referring to FIGS. 1 to 4, a conventional electrical test on an LSI (Large Scale Integrated circuit) is described. FIG. 1 illustrates a circular wafer 11 on which a plurality of circular masks 12 are formed. A plurality of LSIs are formed on each of the masks 12. An electrical test is carried out as to each wafer for aiming at a lot of memory cells in each LSI 13. Specifically, through an electric testing device, certain test data are written into each memory cell on the LSI and thereafter it is checked whether each written datum can be correctly read out therefrom as it was previously written in.

Figure 2:
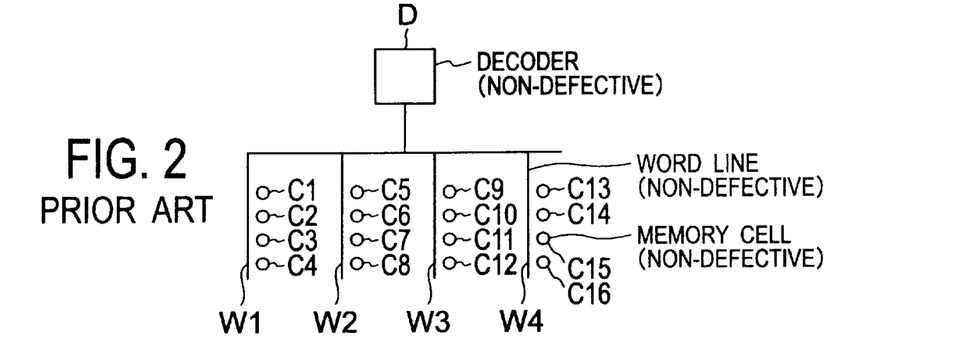
FIG. 2 shows one example of a memory circuit on a wafer.
Figure 3:
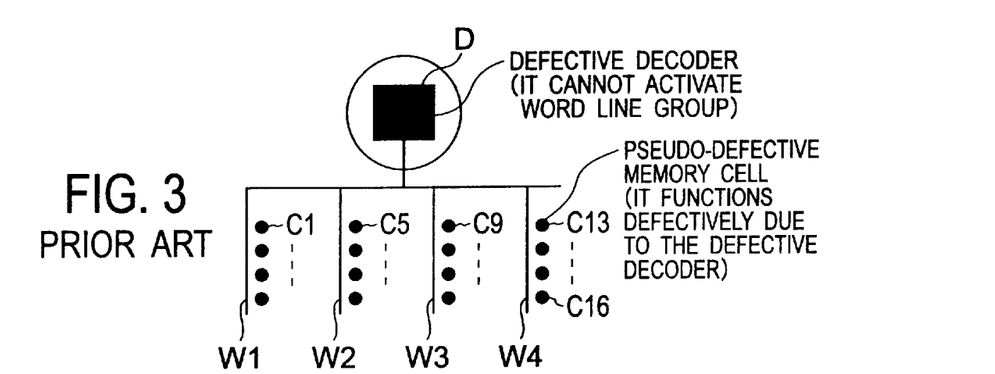
FIG. 3 is a diagram for referring to a case that there is a defect in a primary circuit of the memory circuit in FIG. 2.
Figure 4:
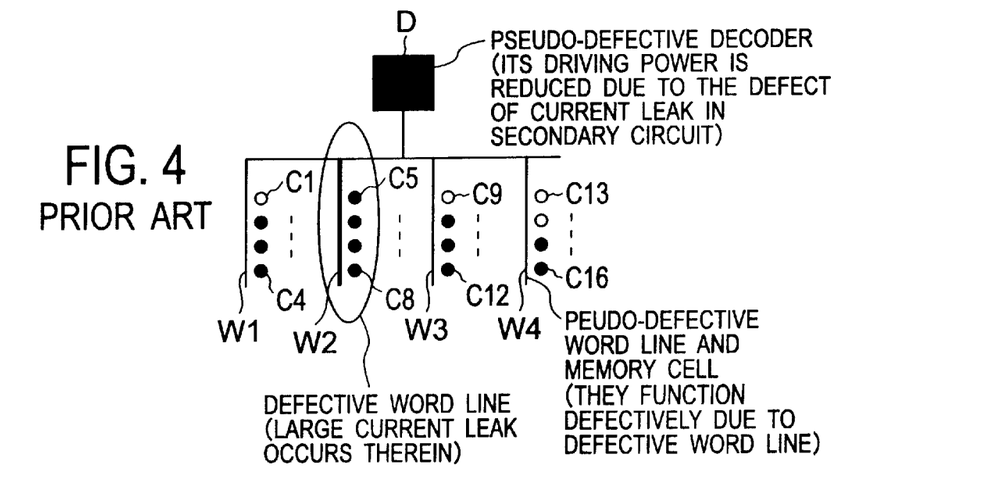
FIG. 4 is a diagram for referring to a case that there a defect in a secondary circuit of the memory circuit in FIG. 2.

Each of FIGS. 2 to 4 shows an example of a memory circuit, individually. In FIG. 2, the memory circuit comprises memory cells (C1 to C16), a word line W1 for driving the memory cells C1 to C4, a word line W2 for driving the memory cells C5 to C8, a word line W3 for driving the memory cells C9 to C12, a word line W4 for driving the memory cells C13 to C16, and a decoder D for activating these word lines W (W1 to W4).

In an LSI having memory cells thereon, the memory cells are arrayed in a matrix form to constitute a cell plate of an aggregation of the memory cells. Each memory cell is defined in a coordinate system by use of an address determined by X and Y. In a memory circuit having a plurality of input/output parts, input/output terminals are additionally provided with the numerical order for representing each address alike by three variables of X, Y and I/O.

Therefore, when an output obtained from designation of an address X, Y is different from its expected value in the electrical test, the electric testing device judges that the memory cell corresponding to the address X, Y is defective.

However, how to analyze the defects is not so simple as how to carry out the electrical test. That is, the memory cells C are activated through wirings of a word line W and a bit line (not illustrated) by such driving circuits as the decoder D and a sense amplifier (not illustrated) which are to drive the memory cell corresponding to a targeted address. The above driving circuits are driven by their further preceding circuits positioned upstream.

Accordingly, when either the decoder D or the sense amplifier is defective, in most cases, each of the related memory cells itself is found to be non-defective by contraries. A defect analysis should be carried out with the aim at not the memory cells C but both of the decoder D and the sense amplifier. Further, if any one of driving circuits preceding the decoder D or the sense amplifier are found to be defective, the preceding driving circuits should be subjected to the defect analysis.

FIG. 3 shows an example where a decoder D is defective. In FIGS. 2 to 4, correctly functioning constituent elements are denoted by the white-painted-out marks. Then, there are donated by the black-painted-out marks both actually defective constituent elements and pseudo-defective constituent elements being not yet concluded to be really defective but regarded as defective judging from the electrical test results.

FIG. 3 also illustrates that all of the decoder D and the memory cells C1 to C16 have already been reckoned to be defective as a result of the electrical tests. However, the same will occur as long as the decoder D is defective even if the memory cells C1–C16 are non-defective. In such a case, it is unmeaning to carry out the defect analyses on the memory cells C1 to C16 one by one. Moreover, practically speaking, the number of memory cells to be activated by the decoder D amounts to from several hundreds to tens of thousands per single decoder. Consequently, if the memory cells are simply intended to be subjected to individual defect analysis, it is involved in physical or statistical analysis about so many components of which number is several hundreds to tens of thousands times as large as that of actually defective components. The countermeasure against this problem is described by the inventors in Japanese Unexamined Patent Publication No. 92833/1998.

In FIG. 4, there may happen so large fall of potential as to deaden a driving power of the decoder D to activate the word line W2 when a current leak occurs in the word line W2. As a result, other word lines W1, W3 and W4 to be activated by the decoder D also become functionally defective under the influence of the word line W2. Heretofore, whenever all word lines W1 to W4 have been found to be functionally defective, the decoder D has been judged to be the same. However, it is neither the decoder D nor the memory cells C1 to C16 but the word line W2 that is really defective.

As mentioned above, there are included one kind of memory cells being inherently defective and the other kind of memory cells being truly non-defective among those memory cells as judged to be defective by the electric testing device.

In order to distinguish between an actually defective memory cell and a pseudo-defective memory cell among those as judged to be defective memory cells as above, it is necessary to re-examine each of all memory cells as such. Such a re-examination requires a great deal of labor.

An address of a memory cell as judged to be defective is obtained from the data of the circuit test results, however, it is far difficult to get hold of where the memory cell is positioned on the wafer.

Figure 5:
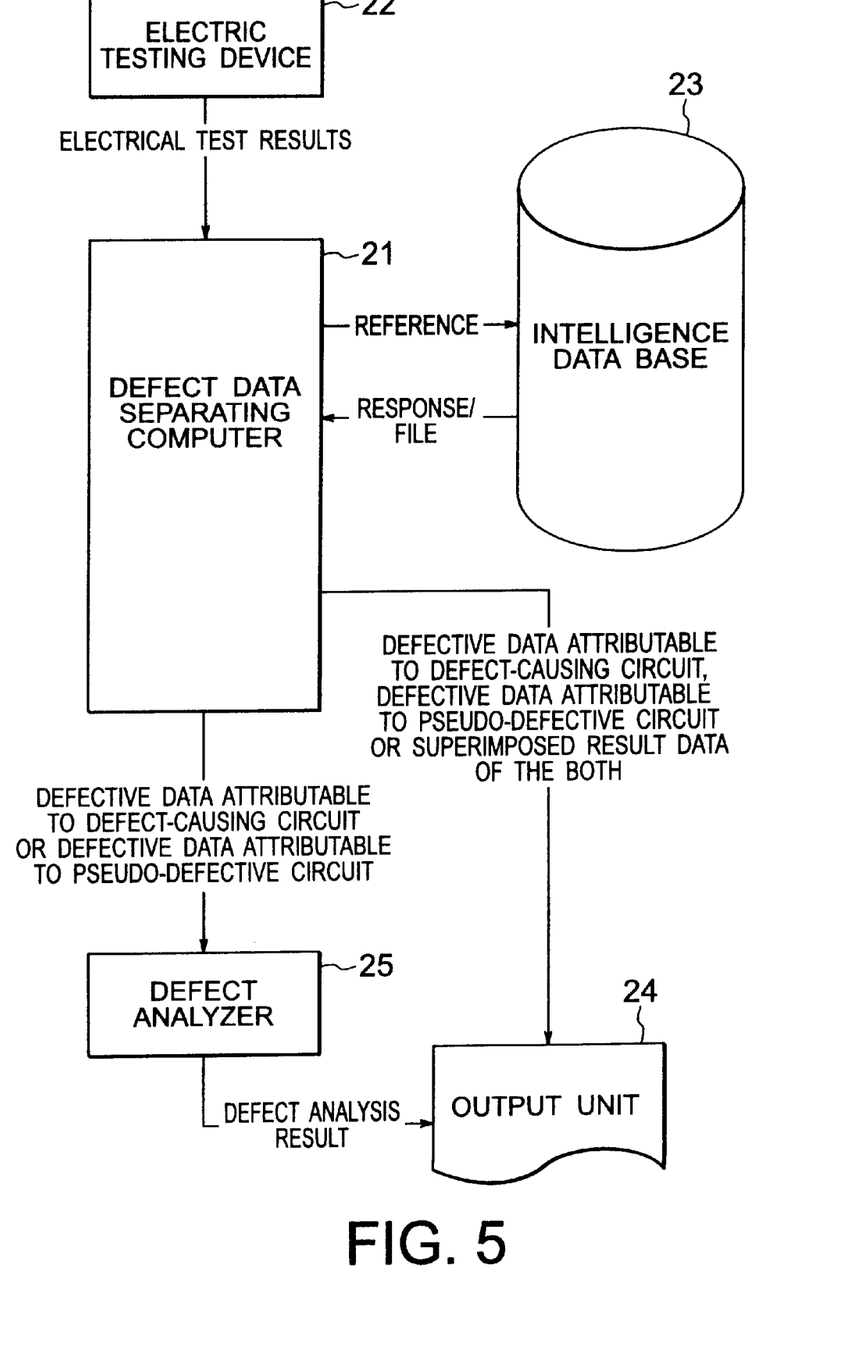
FIG. 5 illustrates a constitution of a circuit test result analyzing apparatus according to a preferred embodiment of the present invention.

Referring to FIG. 5, a circuit test result analyzing apparatus is described according to a preferred embodiment of the present invention. The circuit test result analyzing apparatus comprises a defect data separating computer 21 for separating defect data, into which certain test results of memory cells are to be inputted, and an intelligence data base 23 holding necessary data for the defect data separating computer 21 to analyze the circuit test results. Various defect data are outputted from the defect data separating computer 21 to an output unit 24 such as a printer and so on and to a defect analyzer 25 represented by an electron microscope or an ion beam analyzer. The electric testing device 22 is represented by a memory tester or an LSI tester.

The defect data separating computer 21 is interconnected between the electric testing device 22 and the defect analyzer 25 through a network. The electric testing device 22 examines LSI data cells one by one and outputs these results to the defect data separating computer 21. The data content of the test results outputted from the electric testing device 22 is formed of binary data showing whether each of the LSI data cells is non-defective or defective. The defect data separating computer 21 analyzes the data judged to be defective component data according to the discriminating of the intelligence data base 23 and concludes whether the data are really defective component data. The defect data separating computer 21 outputs the really defective component data as the defect data attributable to a defective circuit, and truly non-defective component data, being previously regarded as defective component data, as the non-defect data attributable to a pseudo-defective circuit. The defect data separating computer 21 includes an analytical program (expert program) for performing such judgments.

As an example of the data corresponding to the defect data attributable to a defective circuit, the data relating to the decoder D in FIG. 3 and the word line W2 in FIG. 4 may be pointed out. Meanwhile, as an example of the data corresponding to the data attributable to a pseudo-defective circuit, there may be designated the data relating to the memory cells C1 to C16 and the word lines W1 to W4 in FIG. 3; the word lines W1, W3 and W4, the memory cells C1 to C16 and the decoder D in FIG. 4, for example.

The intelligence data base 23 holds position data for informing any positions on the wafer at which a plurality of decoders, a plurality of memory cells, a plurality of word lines, etc. are located for forming an LSI. Also the intelligence data base 23 holds interconnection data for informing any mutual interconnection states among a plurality of decoders, a plurality of memory cells, a plurality of word lines, etc. Further, the intelligence data base 23 includes a program which judges, by analyzing how a memory cell being regarded as defective is interconnected in the related circuits, whether the really defective part exists in the memory cell, or in any one of a decoder, a memory cell and a word line, etc. in other components. Such a program comprises a construction represented by the style of "IF . . . THEN . . . ", for example.

Referring to an example in FIG. 3, when all of the memory cells C1 to C16 are judged to be defective through the electric testing device 22, the intelligence data base 23 concludes that the decoder D is really defective, and other memory cells and the word lines W1 to W4, etc. are pseudo-defective.

Likewise, referring to an example in FIG. 4, when all of the memory cells C2 to C8, C10 to C12, C15 and C16 are judged to be defective by means of the electric testing device 22, the intelligence data base 23 concludes that the word line W2 is really defective, and other memory cells C1, C9, C13 and C14, the word lines W1, W3 and W4, and the decoder D are pseudo-defective.

Figure 6:
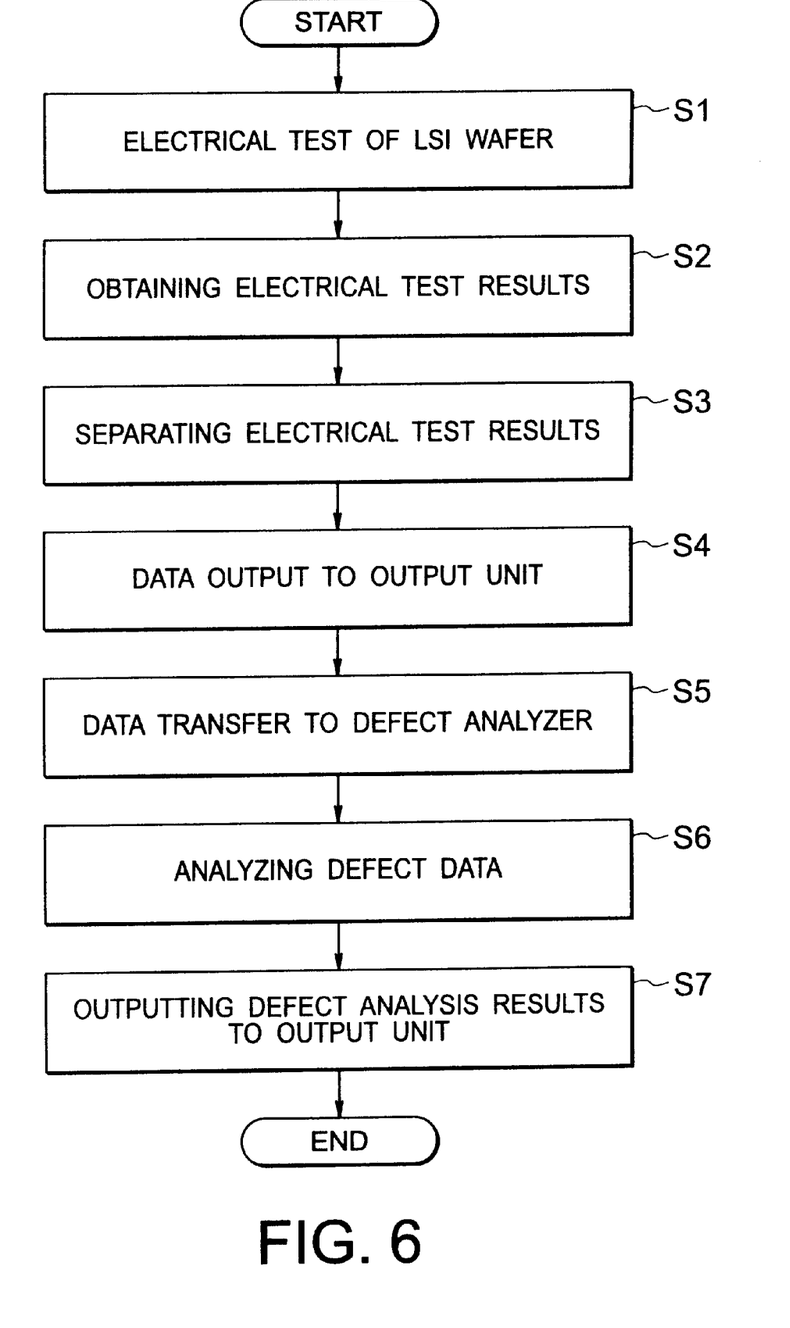
FIG. 6 is a flow chart for explaining a function of the circuit test result analyzing apparatus.
Figure 7:
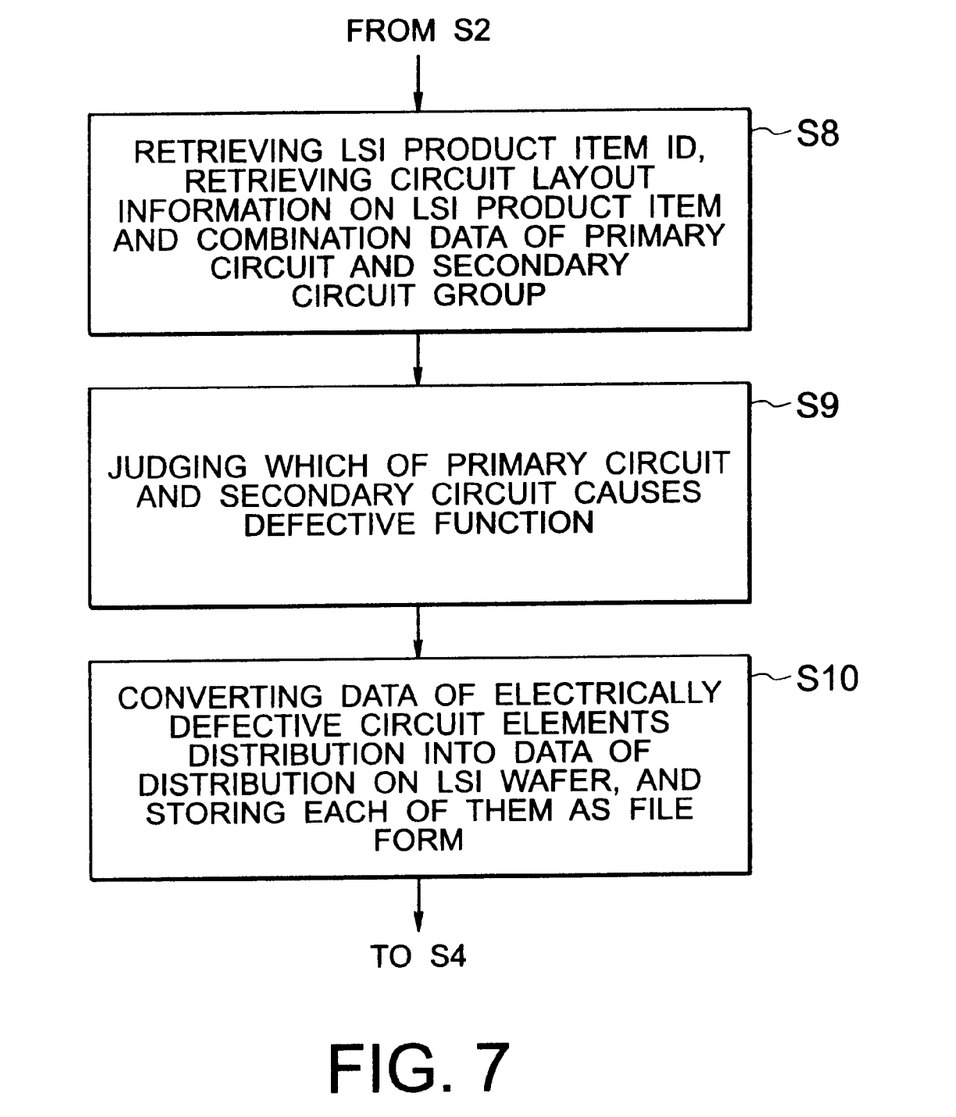
FIG. 7 is a flow chart for describing the content of a Step 3 in FIG. 6 in detail.
Figure 8:
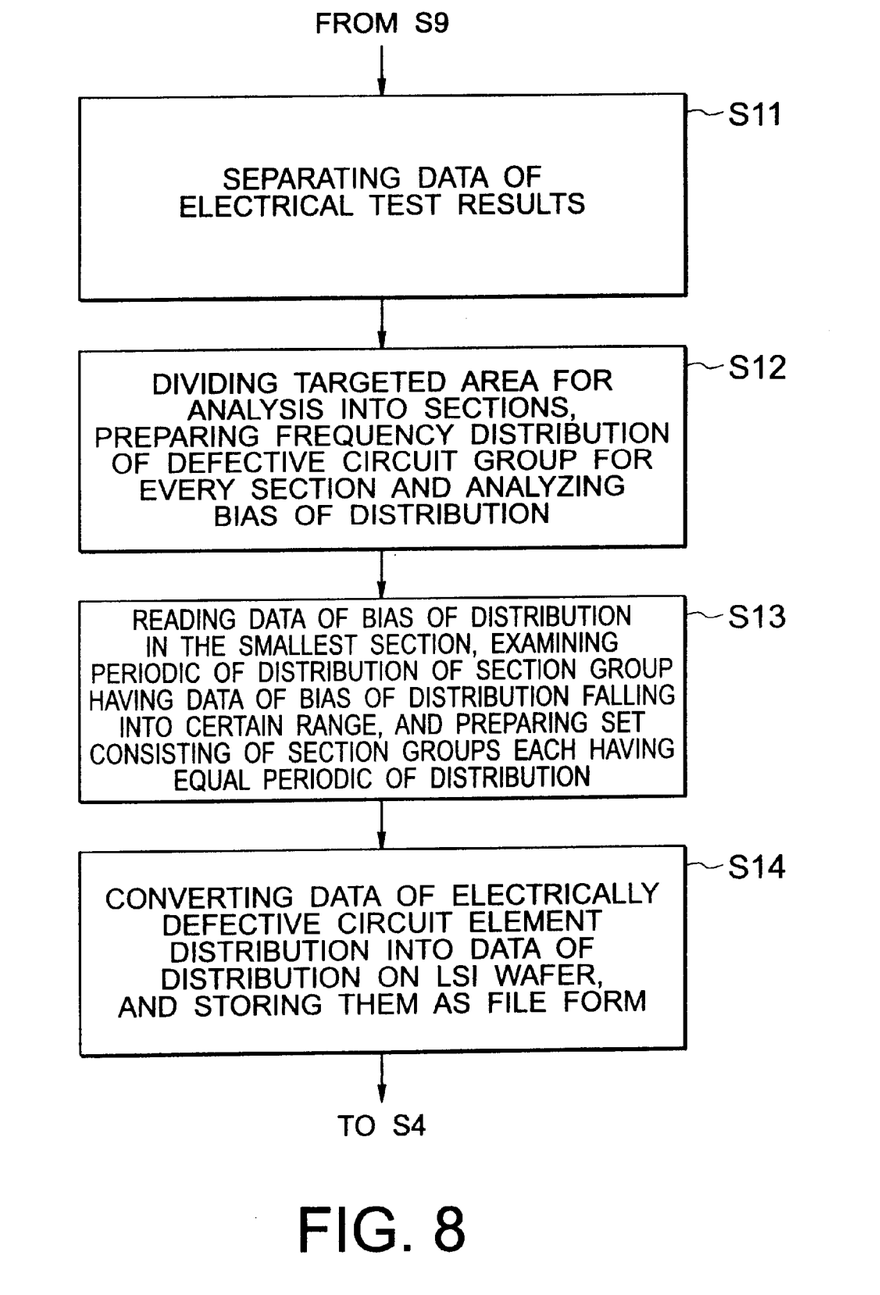
FIG. 8 is a flow chart for describing the content of a Step 10 in FIG. 7 in detail.

Next, referring to FIGS. 6 to 8, a function of the circuit test result analyzing apparatus of the present invention is described. In FIG. 6, the electrical test on an LSI wafer is carried out by the electric testing device 22 (step S1). After the electrical test, the defect data separating computer 21 receives the electrical test results from the electric testing device 22 (step S2).

In a step S3, the defect data separating computer 21 retrieves the interconnection data (data on LSI product items) informing the mutual interconnection states among a plurality of decoders, a plurality of memory cells and a plurality of word lines, etc. The defect data separating computer 21 checks whether there exist the defect data in the combination data relating to any combination of a defective circuit and a pseudo-defective circuit group, and separates the electrical test results into both the defect data attributable to a defective circuit and the other data attributable to a pseudo-defective circuit, and finally stores the resultant data in the intelligence data base 23 as a file form. The step S3 is described in detail separately.

Following the step S3, in a step S4, the defect data separating computer 21 outputs the defect data attributable to the defective circuit, the other data attributable to the pseudo-defective circuit and the superimposed resultant data thereof to the output unit 24, respectively. In a step S5, the defect data separating computer 21 forwards any one of the defect data attributable to the defective circuit, the other data attributable to the pseudo-defective circuit and the superimposed resultant data thereof to the defect analyzer 25.

In a step S6, the defect data from the defect data separating computer 21 is analyzed in the defect analyzer 25. Finally, in a step S7, the defect analyzer 25 outputs the defect analysis results to the output unit 24.

Referring to FIG. 7, the step S3 is described in detail. Steps S8 and S9 are carried out by the defect data separating computer 21 having the expert program. In a step S9, the defect data separating computer 21 retrieves an LSI product item ID in the electrical test result file, and further retrieves the circuit layout information (position information) on the above LSI product item and the combination data (interconnection information) relating to any combination of a primary circuit (viz. the decoder D) and a secondary circuit group (viz. the memory cells C) from among sample data stored in the intelligence data base 23.

In the step S9, when the intelligence data base 23 retrieves certain defect data corresponding to the combination data relating to any combination of the primary circuit and the secondary circuit group from among the electrical test result data to be referred to the intelligence data base 23 by the defect data separating computer 21, the separating computer 21 forms a judgment as below. That is, the defect data separating computer 21 judges that the primary circuit is defective and thereby influences the secondary circuits when all circuits of the secondary circuit group are equally defective. In the meantime, when there is a specific secondary circuit functioning more defectively than any other secondary circuits in the same secondary circuit group, the defect data separating computer 21 judges the specific secondary circuit in concern to be defective.

In a step S10, the defect data separating computer 21 separates the electrical test results into both the defect data file attributable to the defective circuit and the other data file attributable to the pseudo-defective circuit by utilizing the above judgment results. After that, the intelligence data base 23 converts the electrically defective circuit element distribution included in both of the above data files into the distribution ($\mu$m unit coordinate system) on the LSI wafer according to the layout information on the circuit elements, and changes each distribution into a file form for storage therein.

Referring to FIG. 8, the step S10 is described in detail. In the step S11 of FIG. 8, the defect data separating computer 21 separates the electrical test result data into both one kind of data attributable to the defective circuit and the other kind of data attributable to the pseudo-defective circuit according to judgments of the intelligence data base 23.

Figure 9:
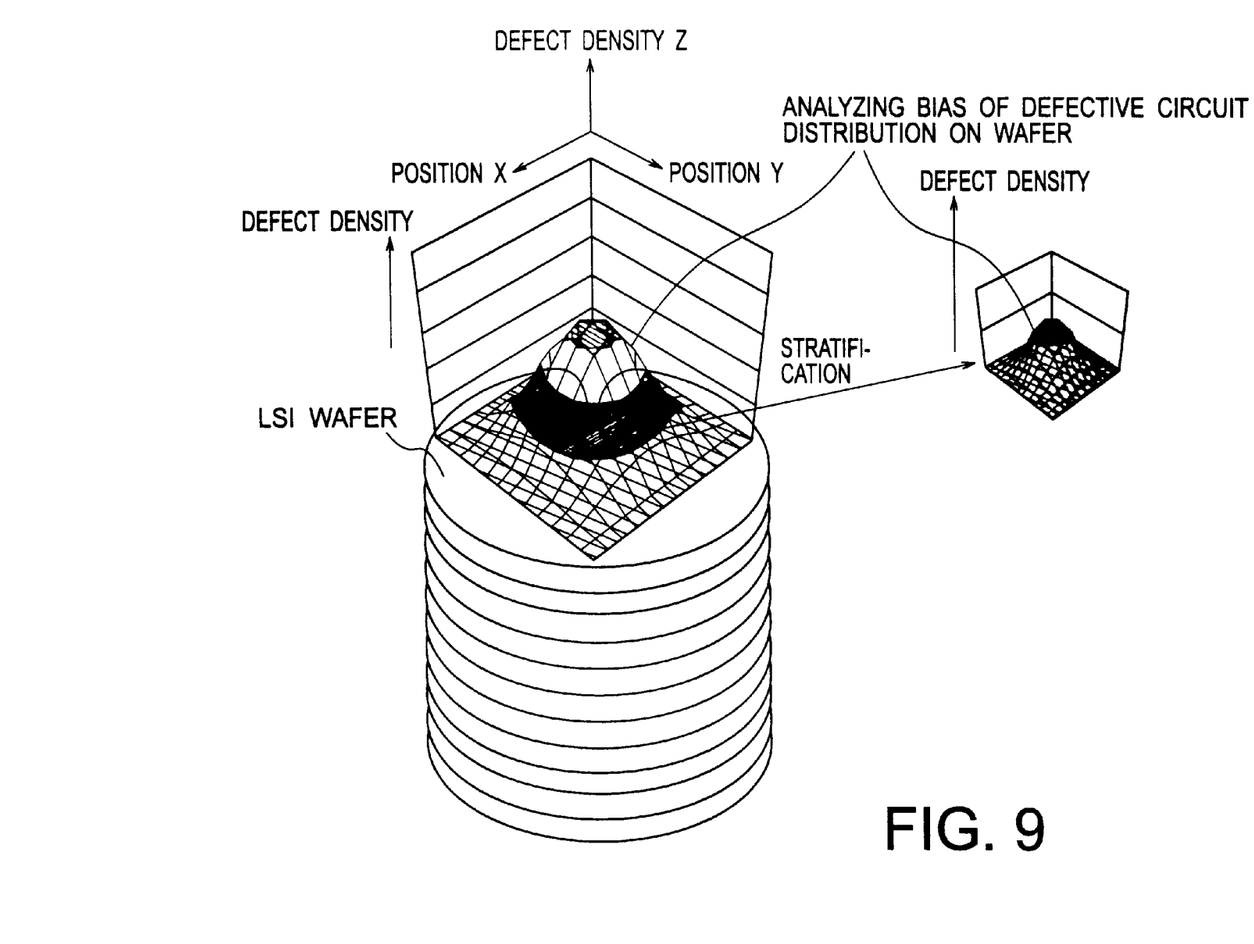
FIG. 9 is a diagram for explaining a frequency distribution of the defects on a wafer according to the present invention.

Next, as illustrated in a defect frequency distribution diagram in FIG. 9, regarding to each defect data, the defect data separating computer 21 divides a targeted area for analysis into sections and forms a frequency distribution (histogram) of defective circuit groups for every divided section to thereby analyze a bias of the distribution. For this analysis, there are used various statistics such as a distribution density, a gap quantity between the center of gravity of each section and the center of distribution density, a skewness and a kurtosis.

FIG. 9 illustrates a defect frequency distribution on an LSI wafer where a two-dimensional position of each circuit element is designated by X-axis and Y-axis. Defect density Z represents the number of defective circuit elements per unit area. The denotations X, Y and Z represents a conventional three-dimensional coordinate system. The higher a height in the Z-direction corresponding to a position (X, Y) becomes, the higher a defect density of circuit elements in the vicinity of the position becomes.

Incidentally, an area-division of dividing a targeted area sectionally means that an area on the LSI wafer is divided into the smaller sections by segmenting each of the X-axis and the Y-axis at a prescribed interval respectively. The distribution density and the defect density are synonymous with each other. The center of gravity of the section is meant by the center of each divided small section. The center of each distribution density is defined as the most high density position of the defects.

The distribution section is defined by use of a width and a length relating to a word line, and an error of a bias of distribution is determined to be within five percent in the time of collecting the section groups for every periodic distribution.

Now getting back to FIG. 8, in the step 12, each section having any defective circuits is employed as a new targeted area from among the sections, and subsequently each area is further divided into the smaller sections for preparing a frequency distribution of defective circuits to analyze a bias of the distribution statistically, such sequential steps are carried out repeatedly so that a stratification and this area-division operation are performed up to the last one circuit, such results are stored in the intelligence data base 23.

Figure 10:
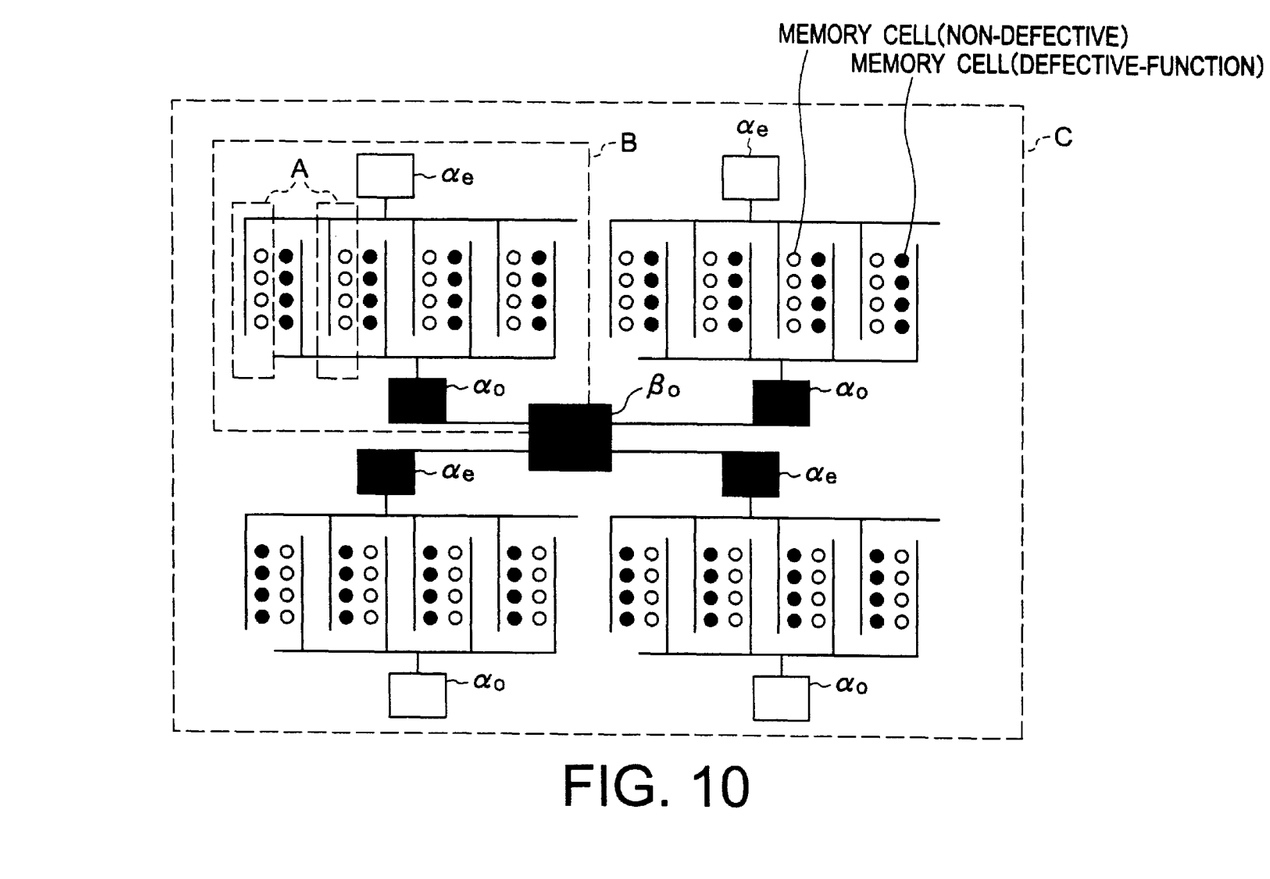
FIG. 10 is a diagram for explaining a method for analyzing the defects in each periodic distribution using a circuit test result analyzing apparatus of the present invention.

FIG. 10 is a drawing for conceptualizing a method of analyzing the defects for every periodic distribution. In which, there are disposed two circuits in the longitudinal and traverse directions respectively, each circuit comprising the decoder D, the memory cells C and the word lines W as illustrated in FIGS. 2 to 4. The four decoders (driving circuits) each denoted by $\alpha e$ and the same each denoted by $\alpha o$ are respectively constituted to be driven by a single main driving circuit $\beta o$.

The defect data separating computer 21 reads the bias data in the smallest sections stored in the intelligence data base 23, as shown in FIG. 10, and examines the periodic distributions where the data of the bias of distribution fall into a certain range, then collects the sections each having the same periodic distribution. Incidentally, the data of the bias of distribution in the above certain range means such data as reckoned to be equal to one another upon employment of an error range of 5%, 10% or 20%.

Referring to FIG. 10 for an exemplary illustration, since the odd number addresses in the group of sections A (the group of a set of four memory cells) are entirely defective, the defect data separating computer 21 collects the odd number's sections A up to the area of a section B, refers to the intelligence data base 23, and subsequently receives such a judgment that the defect is caused by the driving circuit $\alpha o$.

Next, the defect data separating computer 21 reads the bias data in the larger sections than the previously treated sections and examines the periodic distributions of the groups of the sections of which the bias of distribution falling into a certain range and collects the sections having the same periodic distribution, such sequential steps are carried out repeatedly, and subsequently collects the section groups through stratification for every periodic distribution until the largest targeted area for analysis is dealt with, and finally stores the distribution data of electrically defective circuit elements which are stratified for every bias of distribution and periodic distribution in the intelligence data base 23.

For instance, in FIG. 10, the set of the odd addresses in the group of sections A has already been formed up to be as large as the section B and also the driving circuit $\alpha o$ has been already judged to cause the defects. Since each section B has the same bias of distribution, the defect data separating computer 21 collects the sections B within the section C and refers to the intelligence data base 23 to receive such a judgment that the main driving circuit $\beta o$ causes the defects (the step S13 in FIG. 8).

The intelligence data base 23 converts the stratified distribution of an electrically defective circuit elements into a distribution ($\mu$m unit coordinate system) on the LSI wafer to change each distribution into a file form for storage therein. In the example in FIG. 10, the position information of the main driving circuit $\beta o$ is converted into a file form (the step 14 in FIG. 8).

For a supplementary explanation, the expert program for analyzing the circuit test results is previously built-in in the defect data separating computer 11, and the content of the program is concerned with the performances of the forementioned steps S3 to S14 (except the steps S6 and S7). The steps S9, S10 and S14 of these steps S3 to S14 include some content of the intelligence data base 23.

The second preferred embodiment is described below. It is applied to an analysis of test results of a logic LSI. Also in the logic LSI, there are a lot of potential combinations for defining a primary circuit and a secondary circuit group. For example, in a constant-current circuit, there are formed a plurality of constant-current circuits in each block on the LSI, each constant-current circuit supplying the corresponding secondary circuit group with an electric current. In this case, it is defined in the intelligence data base 23 that each constant-current circuit assigned an address (ID for distinction) is to serve as a primary circuit and a circuit group supplied with a current from the constant-current circuit is to serve as a secondary circuit.

When the constant-current circuit is functionally defective, all of the secondary circuits fall into the same. Meanwhile, when a large current leak occurs in any one of the secondary circuits, the supplied current from the constant-current circuit is wasted in the defective circuit where the current leak occurs. Accordingly, each of other secondary circuits supplied with a current from the constant-current circuit becomes pseudo-defective due to an insufficiency of the driving current therefor.

One example of sequentially analytical steps for handling the above case is described below. In the intelligence data base 23, a primary circuit is defined by each constant-current circuit and a secondary circuit is defined as a circuit of each circuit group in the circuit block supplied with a current from the constant-current circuit.

Also, a stratification of a targeted area for analyzing a bias of distribution and a periodic of distribution is defined by use of an area including all of the primary circuits and the secondary circuit groups and an operating voltage range therein. Further, a divided section is defined by use of a width and a length of an individual circuit of each circuit group and an operating voltage 0.05 V therein, and an error of a bias of distribution for collecting the section groups for every periodic of distribution is determined to be within five percent.

When any defects are caused by the constant-current circuit, every circuit of the secondary circuit group connecting therewith becomes functionally defective. Therefore, the bias of the defect distribution in each section is judged to be equal to one another, each section having an equal value as to a width and a length and an operating voltage range of the circuit. The data of the constant-current circuit are held in the file of defect data attributable to a really defective circuit. Then, the data of the secondary circuit groups are held in the file of data attributable to a pseudo-defective circuit as collective data in which the defective sections are disposed continuously (a periodic distribution 1).

Next, when any defects occur due to a leak current of the secondary circuit group, all cells in only one divided section of the secondary circuit group become defective, each divided section having the same width and length. If the operating voltage is raised (the supply current is increased), more than five percent circuits in other circuits become to function normally, and hence the bias of distribution is judged to be different. In this case, the data of the section in which all the cells are functionally defective are held in the file of defect data attributable to a defective circuit. On the other hand, the data of the constant-current circuit are held in the file of data attributable to a pseudo-defective circuit.

Figure 11:
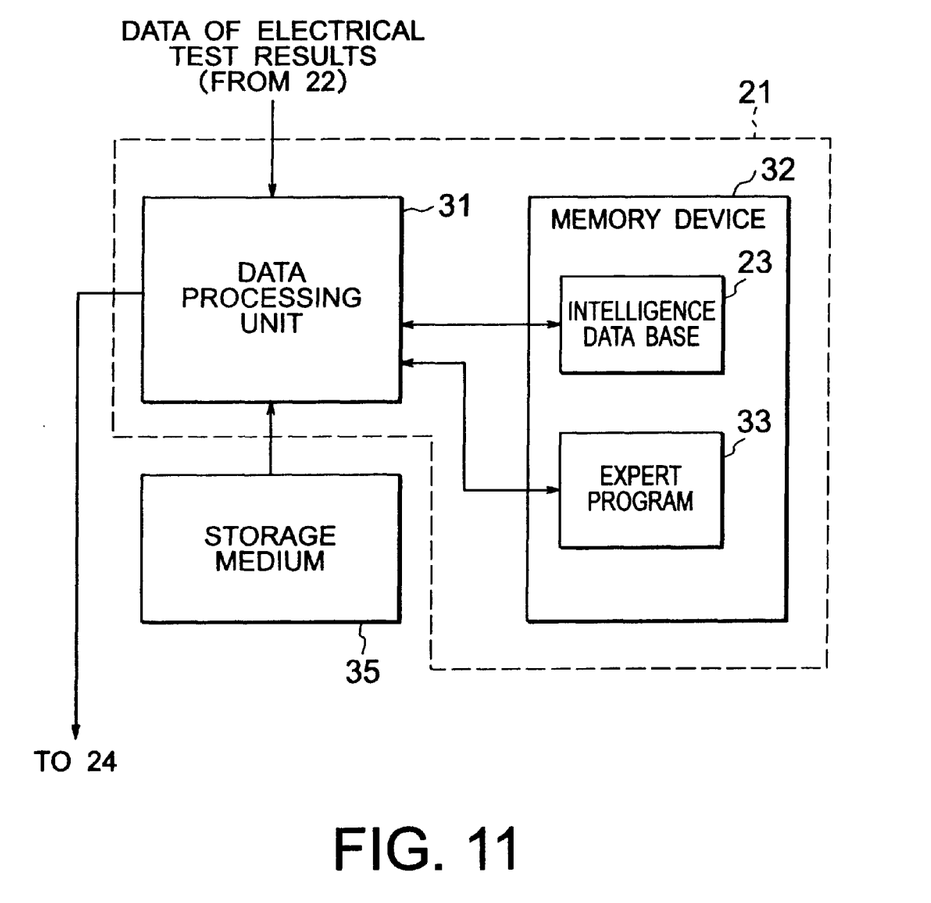
FIG. 11 illustrates a constitution of a computer for separating defect data, which includes a recording medium storing an analytical program.

Now, a storage medium recording an analytical program is described. FIG. 11 is a view illustrating a constitution of the defect data separating computer 21 for separating the defect data. The defect data separating computer 21 comprises a data processing unit 31 and a memory unit 32. The analytical program recorded in a storage medium 35 is inputted into the data processing unit 31.

The analytical program comprising of the expert program 33 and the intelligence data base 23 is recorded in the storage medium 35. When the analytical program recorded in the storage medium 35 is inputted into the data processing unit 31, the data processing unit 31 forwards the analytical program to the memory unit 32 for storage therein. Then, the data processing unit 31 processes the electrical test results inputted from the electric testing device 22 (FIG. 5) in accordance with the analytical program stored in the memory unit 32.

According to the invention, it becomes possible to discriminate between a really defective memory cell and a pseudo-defective memory cell and further designate any position of the really defective memory cell on the wafer.

Also, since a frequency distribution diagram of defective circuits is prepared in the present invention, it is possible to confirm visually the defect frequency distribution.

What is claimed:

1. A circuit test result analyzing apparatus for differentiating between a defect causing circuit and a pseudo-defect causing circuit, based upon test results, obtained for a tested circuit comprising a primary circuit and a secondary circuit group, the secondary circuit group comprising a plurality of secondary circuits each being adapted to cause a defective function under the influence of the primary circuit, the apparatus comprising:

a data base device, that holds, as information in a combination form between the primary circuit and the secondary circuit group, a substrate position information about the primary circuit and the secondary circuit group wherein each are disposed on a substrate, and an interconnection information between the primary circuit and the secondary circuit group, said data base device determining that the primary circuit causes a first defect resulting in a first defect data when all of the plurality of secondary circuits function in the same defective manner, and that a specific secondary circuit causes a second defect resulting in a second defect data when the specific secondary circuit functions more defectively than any other of the plurality of secondary circuits; and a defect data separating device for utilizing the first and second defect data so as to identify each of the primary circuit and at least some of the plurality of secondary circuits as one of the defect causing circuit and the pseudo-defect causing circuit.

2. A circuit test result analyzing apparatus as recited in claim 1, wherein the defect data separating device is adapted to provide an output that is utilized to draw a frequency distribution corresponding to the substrate position information of at least one of the defective circuits and pseudo-defective circuits by utilizing the first and second defect data.

3. A circuit test result analyzing apparatus as recited in claim 1, wherein the primary circuit comprises an LSI decoder, and secondary circuit group comprises LSI memory cells.

4. A circuit test result analyzing apparatus as recited in claim 3, wherein the database device comprises a computer storage unit, adaptable for storing and retrieving at least a predetermined LSI product ID, a circuit layout positional information, and a circuit combination interconnection information relating to any combination of the LSI decoder and the LSI memory cells.

5. A method of analyzing circuit test results for differentiating between a defect causing circuit and a pseudo-defect causing circuit, based upon test results obtained for a tested circuit comprising a primary circuit and a secondary circuit group, the secondary circuit group comprising a plurality of secondary circuits each being adapted to cause a defective function under the influence of the primary circuit, the method comprising the steps of:

storing, as information in a combination form between the primary circuit and the secondary circuit group, a substrate position information about the primary circuit and the secondary circuit group wherein each are disposed on a substrate, and an interconnection information between the primary circuit and the secondary circuit group;

judging that the primary circuit causes a first defect resulting in a first defect data when all of the plurality of secondary circuits function in the same defective manner, and that a specific secondary circuit causes a second defect resulting in a second defect data when the specific secondary circuit functions more defectively than any other of the plurality of secondary circuits; and separating a plurality of defect data by utilizing the first and second defect data so as to identify each of the primary circuit and at least some of the plurality of secondary circuits as one of the defect causing circuit and the pseudo-defect causing circuit.

6. A method of analyzing circuit test results as recited in claim 5, further comprising the step of:

provided an output that is utilized to draw a frequency distribution corresponding to the substrate position information of at least one of the defective circuits and pseudo-defective circuits by utilizing the first and second defect data.

7. A method of analyzing circuit test results as recited in claim 6, further comprising the steps of:

subjecting a targeted area comprising at least a portion of the substrate for analysis to an area-division operation comprising defining a plurality of larger area-divisions of the substrate, and preparing each frequency distribution of at least one of the defective circuits and pseudo-defective circuits for every larger area-division so as to examine each bias of the frequency distribution statistically, with respect to each the first and second defect data; and employing newly each larger area-division that includes any of the defective circuits and pseudo-defective circuits as a new targeted area for analysis and subjecting the new targeted area for analysis to an area-division operation comprising defining a plurality of new area-divisions of the substrate, and preparing each frequency distribution of at least one of the defective circuits and pseudo-defective circuits for every new area-division so as to examine each bias of distribution statistically.

8. A method of analyzing circuit test results as recited in claim 7, further comprising the steps of:

examining frequency distributions of at least one of the new area-divisions, comprising a new area-division group, of which the bias falls into a certain range and collecting the new area-division groups that each have an equal distribution period; and reading the bias data of at least one of the larger area-divisions, comprising a larger area-division group, and examining the distribution states of the larger area-division groups where data of a bias of distribution fall into a certain range and collecting the larger area-division groups having equal distribution periods.

9. A method of analyzing circuit test results as recited in claim 5, wherein:

the primary circuit comprises an LSI decoder, and the plurality of secondary circuits comprise LSI memory cells.

10. A method of analyzing circuit test results as recited in claim 9, wherein:

the database device comprises a computer storage unit, adaptable for storing and retrieving at least a predetermined LSI product ID, a circuit layout positional information, and a circuit combination interconnection information relating to any combination of the LSI decoder and the LSI memory cells.

11. A recording medium that stores an analytical program of test results for differentiating between a defect causing circuit and a pseudo-defect causing circuit, based upon test results obtained for a tested circuit comprising a primary circuit and a secondary circuit group, the secondary circuit group comprising a plurality of secondary circuits each being adapted to cause a defective function under the influence of the primary circuit, the recording medium storing the analytical program and readable by a computer for causing said computer to carry out the steps of:

storing in said computer, as information in a combination form between the primary circuit and the secondary circuit group, a substrate position information about the primary circuit and the secondary circuit group wherein each are disposed on a substrate, and an interconnection information between the primary circuit and the secondary circuit group, determining that the primary circuit causes a first defect resulting in a first defect data when all of the plurality of secondary circuits function in the same defective manner, and that a specific secondary circuit causes a second defect resulting in a second defect data when the specific secondary circuit functions more defectively than any other of the plurality of secondary circuits; and separating a plurality of defect data by utilizing the first and second defect data so as to identify each of the primary circuit and at least some of the plurality of secondary circuits as one of the defect causing circuit and the pseudo-defect causing circuit.

12. A recording medium as recited in claim 11, the recording medium storing a program for causing said computer to further carry out the step of:

providing an output that is utilized to draw a frequency distribution corresponding to the substrate position information of at least one of the defective circuits and pseudo-defective circuits by utilizing the first and second defect data.

13. A recording medium as recited in claim 12, the recording medium storing a program for causing said computer to further carry out the steps of:

subjecting a targeted area comprising at least a portion of the substrate for analysis to an area-division operation comprising defining a plurality of larger area-divisions of the substrate, and preparing each frequency distribution of at least one of the defective circuits and pseudo-defective circuits for every larger area-division so as to examine each bias of the frequency distribution statistically, with respect to each the first and second defect data; and employing newly each larger area-division that includes any of the defective circuits and pseudo-defective circuits as a new targeted area for analysis and subjecting the new targeted area for analysis to an area-division operation comprising defining a plurality of new area-divisions of the substrate, and preparing each frequency distribution of at least one of the defective circuits and pseudo-defective circuits for every new area-division so as to examine each bias of distribution statistically.

14. A recording medium as recited in claim 13, the recording medium storing a program for causing said computer to further carry out the steps of:

examining frequency distributions of at least one of the new area-divisions, comprising a new area-division group, of which the bias falls into a certain range and collecting the new area-division groups that each have an equal distribution period; and reading the bias data of at least one of the larger area-divisions, comprising a larger area-division group, and examining the distribution states of the larger area-division groups where data of a bias of distribution fall into a certain range and collecting the larger area-division groups having equal distribution periods.

* * * * *